(12) United States Patent
Delbrück et al.

(10) Patent No.: US 7,075,130 B2
(45) Date of Patent: Jul. 11, 2006

(54) PHOTOSENSITIVE DEVICE WITH LOW POWER CONSUMPTION

(75) Inventors: Tobias Delbrück, Zürich (CH); Shih-Chii Liu, Zürich (CH); Samual Zahnd, Zürich (CH); Patrick Lichtsteiner, Lucerne (CH)

(73) Assignees: Eidgenossische Technische Hochschule Zurich, Zurich (CH); Universitat Zurich, Zurich (CH)

( * ) Notice: Subject to any disclaimer, the term of this patent is extended or adjusted under 35 U.S.C. 154(b) by 236 days.

(21) Appl. No.: 10/251,208

(22) Filed: Sep. 19, 2002

(65) Prior Publication Data
US 2004/0065876 A1    Apr. 8, 2004

(51) Int. Cl.
*H01L 27/148* (2006.01)
(52) U.S. Cl. .............. 257/233; 257/292; 257/432; 257/444; 257/462
(58) Field of Classification Search .......... 257/233, 257/292, 431–466; 372/43, 50, 92
See application file for complete search history.

(56) References Cited

U.S. PATENT DOCUMENTS

| 5,376,813 A | 12/1994 | Delbruck et al. ......... 257/288 |
| 6,528,777 B1 * | 3/2003 | Ames et al. ............ 250/214 R |

* cited by examiner

*Primary Examiner*—Wai-Sing Louie
(74) *Attorney, Agent, or Firm*—Donald S. Dowden; Cooper & Dunham LLP

(57) ABSTRACT

A photosensitive device with a photodiode and an amplifier is disclosed. The diode is in series with a feedback transistor which forces the voltage derived from the photocurrent to be a logarithmic function of the light intensity. A current mirror is provided which controls the bias current to the amplifier to be proportional to the photocurrent. This arrangement ensures that the amplifier, just as the voltage derived from the photocurrent, becomes faster with increasing light intensity and therefore prevents an unnecessarily high power consumption at low light intensities.

7 Claims, 3 Drawing Sheets

PHOTOSENSITIVE DEVICE WITH LOW POWER CONSUMPTION

FIELD OF THE INVENTION

The invention relates to a photosensitive device. In particular, the invention relates to an adaptive photosensitive device with nonlinear response.

BACKGROUND OF THE INVENTION

Photosensors with a photodiode and an amplifier are widely known. U.S. Pat. No. 5,376,813 describes such a device with logarithmic response and a frequency dependent feedback loop for increasing AC gain.

In order to use this type of device for dynamic signals, the amplifier must have sufficient bandwidth for handling even the fastest signals of interest. Since fast amplifiers require large supply currents, the power consumption of the device may become undesirably high for low power applications, such as solar or battery powered apparatus.

BRIEF SUMMARY OF THE INVENTION

Hence, it is a general object of the invention to provide a device of this type with low power requirements.

Now, in order to implement these and still further objects of the invention, which will become more readily apparent as the description proceeds, the photosensitive device comprises at least one photodiode, at least one feedback element in series to said photodiode, wherein said feedback element is controlled to become increasingly conductive as a photocurrent through said photodiode increases, at least one amplifier amplifying a signal derived from the photocurrent and having a gain-bandwidth product, and control means for automatically controlling the gain-bandwidth product of the amplifier such that the gain bandwidth product increases with the photocurrent over at least part of a range of the photocurrent.

In another aspect of the invention, the photosensitive device comprises at least one photodiode, at least one feedback element in series to said photodiode, wherein said feedback element is controlled to become increasingly conductive as a photocurrent through said photodiode increases, an amplifier comprising at least one amplifier transistor, which amplifier transistor amplifies a signal derived from the photocurrent, and a current source generating a source-drain current of said amplifier transistor, which source-drain current increases with said photocurrent over at least part of a range of said photocurrent.

In a further aspect of the invention, the photosensitive device comprises at least one photodiode, at least one feedback element in series to said photodiode, wherein said feedback element is controlled to become increasingly conductive as a photocurrent through said photodiode increases, an amplifier amplifying a signal derived from the photocurrent and having a current input controlling a gain-bandwidth product of the amplifier, and a current mirror for generating a control current to said current input, wherein said control current is proportional to the photocurrent.

In yet another aspect of the invention, the photosensitive device comprises at least one photodiode, at least one feedback element in series to said photodiode, wherein said feedback element is controlled to become increasingly conductive as a photocurrent through said photodiode increases, an amplifier amplifying a signal derived from the photocurrent, and a current mirror for generating a supply current to said current input, wherein said supply current is proportional to the photocurrent.

Hence, an increase of the photocurrent leads automatically to an increase of the gain-bandwidth product of the amplifier or to an increase of the current through the amplifying transistor or to an increase of the amplifier's supply current, respectively. This leads to an automatic adaptation of the response time of the amplifier to the signal derived from the photocurrent. When the photocurrent is low, the response time of the signal derived from the photocurrent is low, and therefore the response time or gain-bandwidth product of the amplifier can be low as well. When the photocurrent is high and the signal derived from the photocurrent becomes faster, the response time of the amplifier is adjusted automatically. Hence, the device avoids an unnecessary high power consumption at low photocurrents.

In particular for devices having a large dynamic range, the amplifier is preferred to have a low DC-gain and a high AC-gain in order to operate over several decades of average input light intensities.

In addition, to maintain invariance to absolute illumination, the gain of the device should be inversely proportional to illumination.

The device according to the present invention is especially suited for being powered by a photocell because the power consumption will automatically be scaled with the available light intensity.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Figure 1:
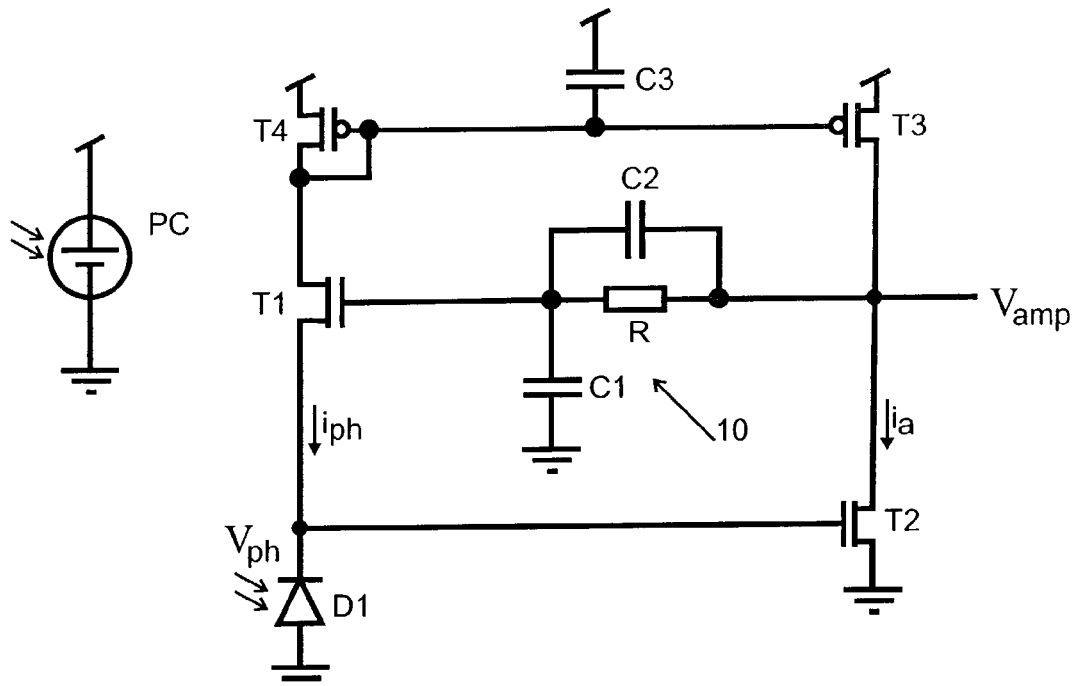
FIG. 1 is a first embodiment of the invention.

FIG. 1 shows an embodiment of a photosensitive device according to the present invention. The device comprises a photodiode D1 in series with the source-drain channel of a feedback transistor T1 and the source-drain channel of a first transistor T4 of a current mirror. A node between photodiode D1 and feedback transistor T1 is connected to the gate of an amplifier transistor T2. Amplifier transistor T2 is in series to a second transistor T3 of the current mirror. The source of transistor T2 is connected to ground, and the drain is connected to an output $V_{amp}$ of the device, as well as to transistor T3 and to a feedback network 10. Feedback network 10 feeds the signal from output $V_{amp}$ back to feedback transistor T1. It consists of a first capacitor C1 connecting the gate of feedback transistor T1 to ground, as well as of a second capacitor C2 and a resistor R arranged in parallel between output $V_{amp}$ and the gate of feedback transistor T1. A further capacitor C3 has a first terminal connected to the gates of the transistors T3 and T4 and a second terminal connected to a fixed voltage, such as the positive supply voltage of the device.

Similar to the circuit described in U.S. Pat. No. 5,376,813, the device of FIG. 1 amplifies the signal derived from the photocurrent $i_{ph}$ through photodiode D1 in amplifier transistor T2. Feedback network 10 provides a weak negative feedback for AC-signals (for which capacitors C1 and C2 act as a voltage divider) and a strong negative feedback for DC currents (for which output $V_{amp}$ is connected to the gate of transistor T1 with a gain substantially equal to 1). In other words, the AC gain of feedback network 10 is smaller than its DC gain.

The drain-source channel of transistor T1 is controlled to become increasingly conductive as the photocurrent increases. As the one described in U.S. Pat. No. 5,376,813, the device of FIG. 1 has a logarithmic dependence of DC output voltage vs. DC input light intensity and shows a small-signal AC gain much larger than the small-signal DC gain at a given operating point, i.e. the AC gain is much larger than the DC gain.

Transistor T3 provides the current $i_a$ through the drain-source channel of amplifier transistor T2. This current controls the response time and the gain-bandwidth product of the amplifier formed by amplifier transistor T2.

In the device described in U.S. Pat. No. 5,376,813, current $i_a$ was set to a constant value by connecting the gate of transistor T3 to a fixed reference potential. In the present device, transistors T3 and T4 form a current mirror generating a "mirrored" current (the current $i_a$) from an "original" current (the photocurrent $i_{ph}$), where these terms are to be understood such that the "mirrored" current is proportional to, but not necessarily equal to, the "original" current. In the embodiment of FIG. 1 with only a single photodiode, current $i_a$ should be considerably larger than photocurrent $i_{ph}$ in order to have a sufficiently high gain-bandwidth product in amplifier transistor T2, i.e. $i_a = k \cdot i_{ph}$ with k>>1. As known to a person skilled in the art, the factor k is defined by the relative sizes of the transistors T3 and T4.

Capacitor C3 is chosen to be sufficiently large such that the response time of the current mirror is larger than the length of any AC signals of interest. In other words, current $i_a$ should be proportional to the average (DC) photocurrent $i_{ph}$ and not be substantially affected by short variations of $i_{ph}$. If C3 is too small, the circuit is unstable and will oscillate.

As mentioned above, using a current mirror as shown in FIG. 1 allows to keep the bandwidth or gain-bandwidth product of amplifier transistor T2 in synch with the bandwidth of the signal derived from the photocurrent. The larger the photocurrent $i_{ph}$ becomes, the faster transistor T1 and transistor T2 will be.

This is especially advantageous if the power for the device is provided by a photocell PC, as indicated in FIG. 1, in particular if the light impinging on photocell (solar cell) PC is from substantially the same source as the light to be measured by diode D1. If only little light is available, photocurrent $i_{ph}$ will be small, hence current $i_a$ through amplifier transistor T2 will be small as well. At the same time, photocell PC will only be able to deliver a small amount of power. When light intensities are strong, photocurrent $i_{ph}$ as well as current $i_a$ will become stronger and the response times of diode and amplifier will decrease. At the same time, photocell PC is well illuminated and therefore able to generate the required currents.

Figure 2:
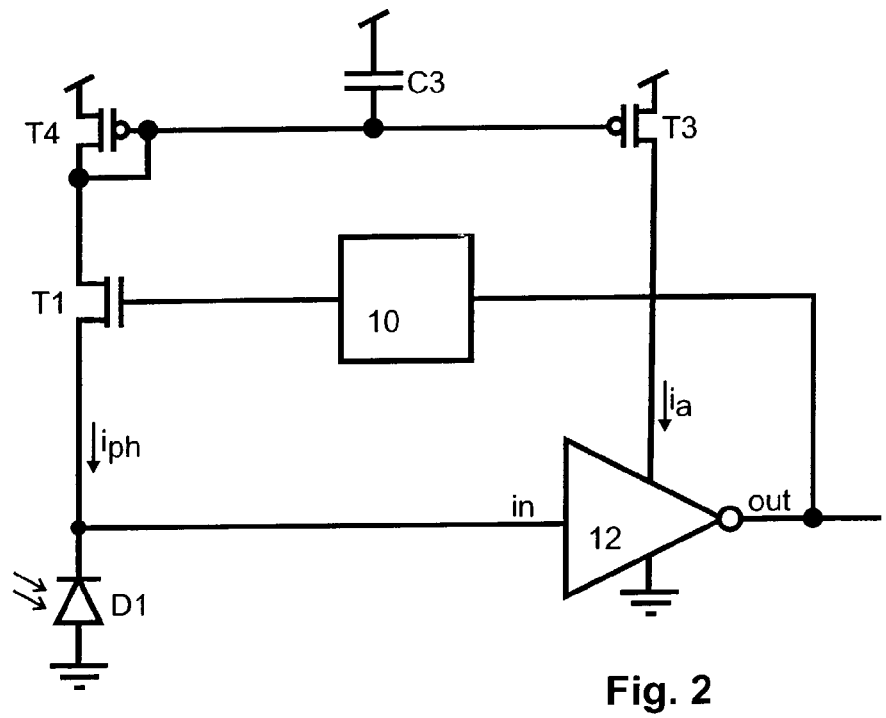
FIG. 2 is a block diagram of a device according to the invention.

FIG. 1 is one possible embodiment of the present invention. FIG. 2 shows a somewhat generalized embodiment, where amplifier transistor T2 has been replaced by a generic active inverting amplifier 12, and specific details of feedback network 10 have been omitted.

Figure 3:
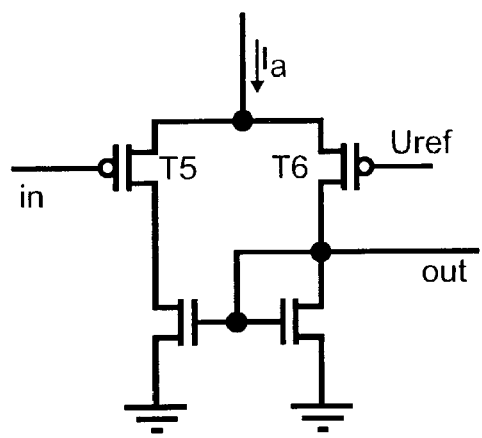
FIG. 3 is a possible embodiment of an amplifier for the device of FIG. 2.

Amplifier 12 can be any suitable amplifier the power consumption and the response time or gain-bandwidth product of which can be controlled by a control current $i_a$. A further embodiment of such an amplifier is shown in FIG. 3. The amplifier of FIG. 3 uses a well-known differential amplifier design with the control current $i_a$ being fed through the two amplifying transistors T5, T6, wherein the gate of transistor T6 is set to a constant voltage $U_{ref}$ and the gate of transistor T5 is the amplifier's input terminal.

Feedback network 10 can also have a design that deviates from the one of FIG. 1. For example, the design of the "adaptive element" of U.S. Pat. No. 5,376,813 can be used.

Figure 4:
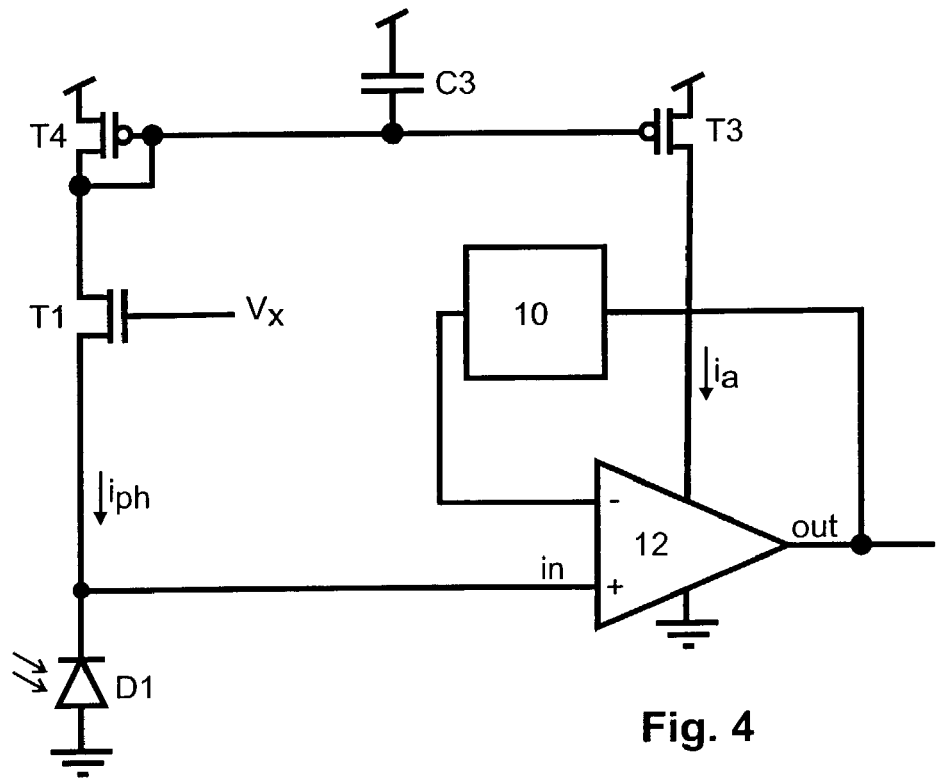
FIG. 4 is a block diagram of another device according to the invention.

In the embodiments of FIGS. 1–3, feedback network 10 fed the output signal back to feedback transistor T1. However, the gate of feedback transistor T1 can also be set to a constant voltage, as shown in FIG. 4. In this case, amplifier 12 should preferably be designed to have higher AC than DC gain, e.g. by feeding its output through feedback network 10 back to its inverting input.

In all the embodiments shown here, control current $i_a$ is controlled to be proportional to photocurrent $i_{ph}$ and is fed as a supply current to the amplifier in order to increase the amplifier's response speed or gain-bandwidth product at high illuminations. It is, however, also possible to modify the current mirror circuit, e.g. by applying a resistor or current sink in parallel to the source-drain channel of transistor T3, such that the relation between photocurrent $i_{ph}$ and control current $i_a$ is non-linear. In particular, it can be advantageous to make sure that current $i_a$ does not fall below a given minimum threshold in order to maintain a stable operation of the amplifier even at low light intensities, or an upper limit can be set for current $i_a$ in order to avoid unnecessarily high power consumption. However, over at least part of an expected range of photocurrent $i_{ph}$, current $i_a$ and therefore the amplifier's response speed or gain-bandwidth product should increase with an increase of photocurrent $i_{ph}$.

Figure 5:
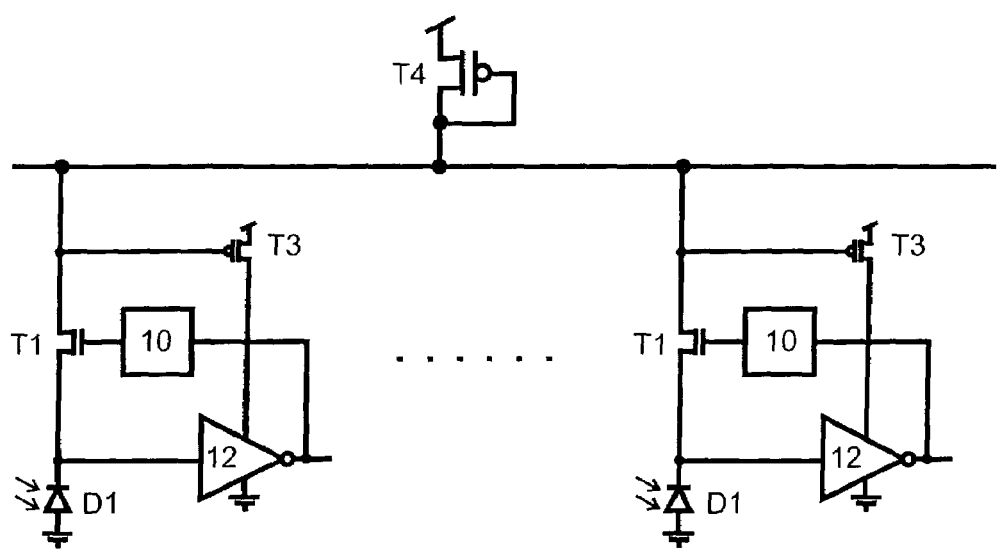
FIG. 5 is a block diagram of a device with several photodiodes and amplifiers.

The devices shown so far had only one single photodiode D1 and one single amplifier 10. For many applications, a one or two-dimensional array of such devices is required. FIG. 5 shows a simplified design for such an array of several devices each having their own photodiode D1 and amplifier 12. In the shown embodiment, all the devices share a single transistor T4 for the current mirror. Transistor T4 detects the sum of all photocurrents such that the current $i_a$ in each array element will be proportional to this sum.

An advantage of this shared bias is that the required current multiplication factor k is obtained by using a plurality of devices rather than by using transistors of strongly differing geometries, leading to a saving of area and a simplification of the overall design.

While there are shown and described presently preferred embodiments of the invention, it is to be distinctly understood that the invention is not limited thereto but may be otherwise variously embodied and practised within the scope of the following claims.

The invention claimed is:

1. A photosensitive device comprising
   at least one photodiode,
   at least one feedback element in series to said photodiode, wherein said feedback element is controlled to become increasingly conductive as a photocurrent through said photodiode increases,
   at least one amplifier amplifying a signal derived from the photocurrent and having a gain-bandwidth product, and control means for automatically controlling the gain-bandwidth product of the amplifier such that the gain bandwidth product increases with the photocurrent over at least part of a range of the photocurrent,
wherein the photosensitive device has a logarithmic dependence of DC output voltage vs. DC input light intensity.

2. A photosensitive device comprising
at least one photodiode,
at least one feedback element in series to said photodiode, wherein said feedback element is controlled to become increasingly conductive as a photocurrent through said photodiode increases,
at least one amplifier amplifying a signal derived from the photocurrent and having a gain-bandwidth product, and
control means for automatically controlling the gain-bandwidth product of the amplifier such that the gain bandwidth product increases with the photocurrent over at least part of a range of the photocurrent,
further comprising a plurality of photodiodes and amplifiers, wherein the control means controls the gain-bandwidth product of the amplifiers such that the gain bandwidth product increases with a sum of the photocurrents over at least part of a range of the sum of the photocurrents.

3. A photosensitive device comprising
at least one photodiode,
at least one feedback element in series to said photodiode, wherein said feedback element is controlled to become increasingly conductive as a photocurrent through said photodiode increases,
an amplifier comprising at least one amplifier transistor, which amplifier transistor amplifies a signal derived from the photocurrent, and
a current source comprising a first transistor with a drain-source channel in series to said photodiode for sensing said photocurrent and a second transistor with a drain-source channel in series to said amplifier transistor, wherein said second transistor is controlled by said first transistor to generate a source-drain current of said amplifier transistor, which source-drain current increases with said photocurrent over at least part of a range of said photocurrent.

4. The photosensitive device of claim 3 wherein said current source comprises a current mirror for generating the source-drain current proportionally to the photocurrent.

5. The photosensitive device of claim 4 wherein said current mirror comprises a first transistor with a drain-source channel in series to the photodiode and a second transistor with a drain-source channel in series with a drain-source channel of the amplifier transistor.

6. The photosensitive device of claim 3 comprising a feedback transistor with a drain-source channel in series to said photodiode, said drain-source channel being controlled to become increasingly conductive as the photocurrent increases.

7. A photosensitive device comprising
at least one photodiode,
at least one feedback element in series to said photodiode, wherein said feedback element is controlled to become increasingly conductive as a photocurrent through said photodiode increases,
an amplifier comprising at least one amplifier transistor, which amplifier transistor amplifies a signal derived from the photocurrent, and
a current source generating a source-drain current of said amplifier transistor, which source-drain current increases with said photocurrent over at least part of a range of said photocurrent,
further comprising a feedback transistor with a drain-source channel in series to said photodiode, said drain-source channel being controlled to become increasingly conductive as the photocurrent increases,
wherein an output of said amplifier is connected via a feedback network to a gate of said feedback transistor, wherein said feedback network has a DC gain larger than an AC gain.

* * * * *